United States Patent
Park et al.

(10) Patent No.: US 6,256,257 B1
(45) Date of Patent: Jul. 3, 2001

(54) MEMORY DEVICE INCLUDING A BURN-IN CONTROLLER FOR ENABLING MULTIPLE WORDINESS DURING WAFER BURN-IN

(75) Inventors: Youn-sik Park; Sun-min Lee, both of Seongnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/514,467

(22) Filed: Feb. 28, 2000

(30) Foreign Application Priority Data

Apr. 7, 1999 (KR) .................................................. 99-12030

(51) Int. Cl.$^7$ ..................................................... G11C 8/00
(52) U.S. Cl. ........................................ 365/230.06; 365/201
(58) Field of Search .............................. 365/230.06, 201, 365/230.01

(56) References Cited

U.S. PATENT DOCUMENTS

| | | | |
|---|---|---|---|
| 5,471,429 | * 11/1995 | Lee et al. | 365/201 |
| 5,590,079 | * 12/1996 | Lee et al. | 365/201 |
| 5,638,331 | * 6/1997 | Cha et al. | 365/201 |
| 5,680,362 | * 10/1997 | Parris et al. | 365/230.01 |
| 5,986,917 | * 11/1999 | Lee | 365/96 |
| 6,084,808 | * 7/2000 | Lim et al. | 365/201 |

* cited by examiner

Primary Examiner—Richard Elms
Assistant Examiner—Anh Phung
(74) Attorney, Agent, or Firm—Skjerven Morrill MacPherson LLP; David W. Heid

(57) ABSTRACT

A semiconductor memory device is capable of simultaneously driving multiple wordlines during wafer burn-in. The semiconductor memory device includes a wordline driving block, a predecoder, a row decoding block, and a burn-in controller. The row decoding block connects to the burn-in controller and the wordline driving block and generates a plurality of wordline enable signals for controlling the wordline driving block. The row decoding block includes a plurality of row decoders, each associated with multiple wordlines. For normal memory accesses, decoding units in the row decoders determine which of the row decoders are activated. In a wafer burn-in mode, the burn-in controller controls which or the row decoders are activated. Transistors in the decoding units can be sized for enabling single wordlines, and transistors in the burn-in controller can be sized for simultaneously enabling multiple wordlines. Accordingly, the semiconductor memory device can sufficiently activate the multiple wordlines during the wafer burn-in although the driving ability of the row decoder is small.

15 Claims, 3 Drawing Sheets

MEMORY DEVICE INCLUDING A BURN-IN CONTROLLER FOR ENABLING MULTIPLE WORDINESS DURING WAFER BURN-IN

BACKGROUND OF THE INVENTION

1. Field of the Invention

The present invention relates to semiconductor memory devices and to driving a plurality of wordlines during burn-in of a device with a row decoder having limited driving ability.

2. Description of the Related Art

Advances in semiconductor technology have increased the capabilities of semiconductor devices and made the devices smaller. In particular, the demand for semiconductor memory devices having large capacity has rapidly increased with the development of computers. In response to that demand, semiconductor memory devices have become smaller while still providing large storage capacity. Accordingly, memory cells in the semiconductor memory devices must be small, and the row decoders for selecting the memory cells are correspondingly small. Such row decoders commonly include NMOS transistors for decoding received row addresses. These NMOS transistors must be small to make the row decoders compact. Accordingly, the driving abilities of the row decoders are small.

To improve the reliability of the semiconductor memory devices, a wafer containing a plurality of semiconductor memory devices often undergoes a burn-in test process. The wafer burn-in test process applies burn-in stress to the wafer and functionally tests the semiconductor memory devices on the wafer. In particular, the burn-in test sequentially or simultaneously activates wordlines in the semiconductor memory devices while applying the burn-in stress to the wafer. Simultaneously activating multiple wordlines during the burn-in test may require a driving ability that is greater than the driving ability of the row decoder, particularly when the row decoder is small. As a result, the row decoder used for normal memory accesses cannot drive a plurality of wordlines during the wafer burn-in, which results in an incomplete wafer burn-in test. Accordingly, the semiconductor memory devices that pass the burn-in test may be unreliable.

SUMMARY OF THE INVENTION

In accordance with an aspect of the present invention, a semiconductor memory device includes a burn-in controller that allows the device to sufficiently drive a plurality of wordlines for a wafer burn-in test even when a row decoder is otherwise inadequate for driving multiple wordlines.

One embodiment of the invention is a semiconductor memory device including a predecoder, a row decoding block, a wordline driving block, and a burn-in controller. The predecoder receives an external row address and pre-decodes the row address to generate a plurality of predecoding signals. The row decoding block, which is connected to the burn-in controller and the wordline driving block, generates a plurality of wordline enable signals that control the wordline driving block when the burn-in controller sets the semiconductor memory device in a wafer burn-in mode.

In accordance with another aspect of the invention, the row decoding block includes a plurality of main row decoders. Each main row decoder includes a main row decoding unit connected to the burn-in controller. The main row decoding unit receives upper predecoding signals from among the plurality of predecoding signals and decodes the upper predecoding signals when a master clock signal is enabled. The main row decoding unit connects to at least four wordline enable signal generators, which connect to the wordline driving block. The wordline enable signal generators receive a precharging signal and lower predecoding signals from among the plurality of predecoding signals and generate the wordline enable signals. The wordline enable signal generators deactivate the wordline enable signals when the precharging signal is asserted, and assert the wordline enable signals in response to the lower predecoding signals and the output of the burn-in controller.

According to the present invention, the semiconductor memory device can sufficiently activate the plurality of wordlines during the wafer burn-in although the driving ability of the row decoder is small.

BRIEF DESCRIPTION OF THE DRAWINGS

The above features and advantages of the present invention will become more apparent by describing in detail an exemplary embodiment thereof with reference to the attached drawings in which.

Use of the same reference symbols in different figures indicates similar or identical items.

DESCRIPTION OF THE PREFERRED EMBODIMENT

Figure 1:
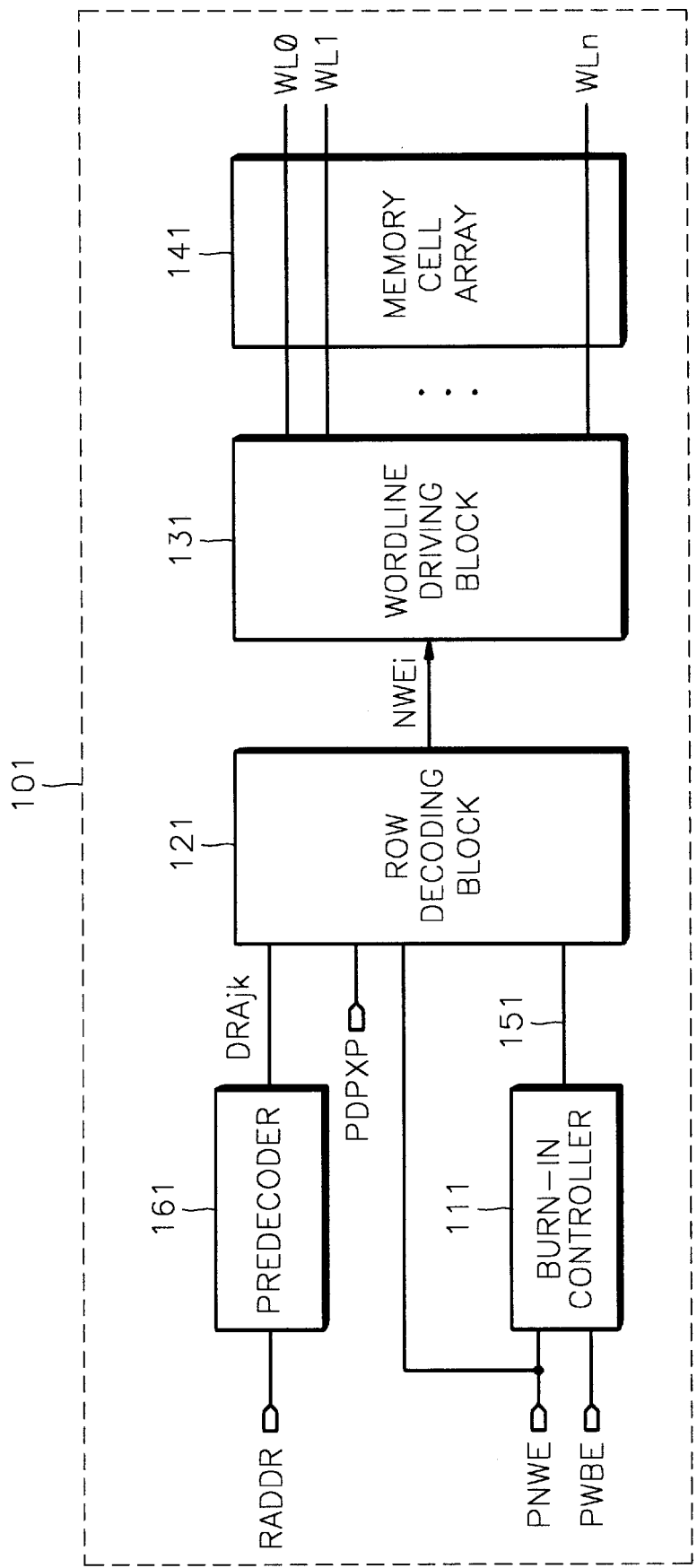
FIG. 1 is a block diagram of a semiconductor memory device according to an exemplary embodiment of the present invention.

Hereinafter, an exemplary embodiment of the present invention is described with reference to the attached drawings. FIG. 1 is a block diagram of a semiconductor memory device 101 according to the exemplary embodiment of the invention. The semiconductor memory device 101 includes a burn-in controller 111, a row decoding block 121, a wordline driving block 131, a memory cell array 141, and a predecoder 161. The memory cell array 141 can be a conventional memory array such as a DRAM array and includes a plurality of wordlines WL0 through WLn.

The burn-in controller 111 receives a master clock signal PNWE and a wafer burn-in enable signal PWBE. The wafer burn-in enable signal PWBE is asserted to a first voltage level, for example, logic high when a semiconductor memory device 101 is in a wafer burn-in mode. The master clock signal PNWE is asserted to logic high when activating the row decoding block 121.

Figure 2:
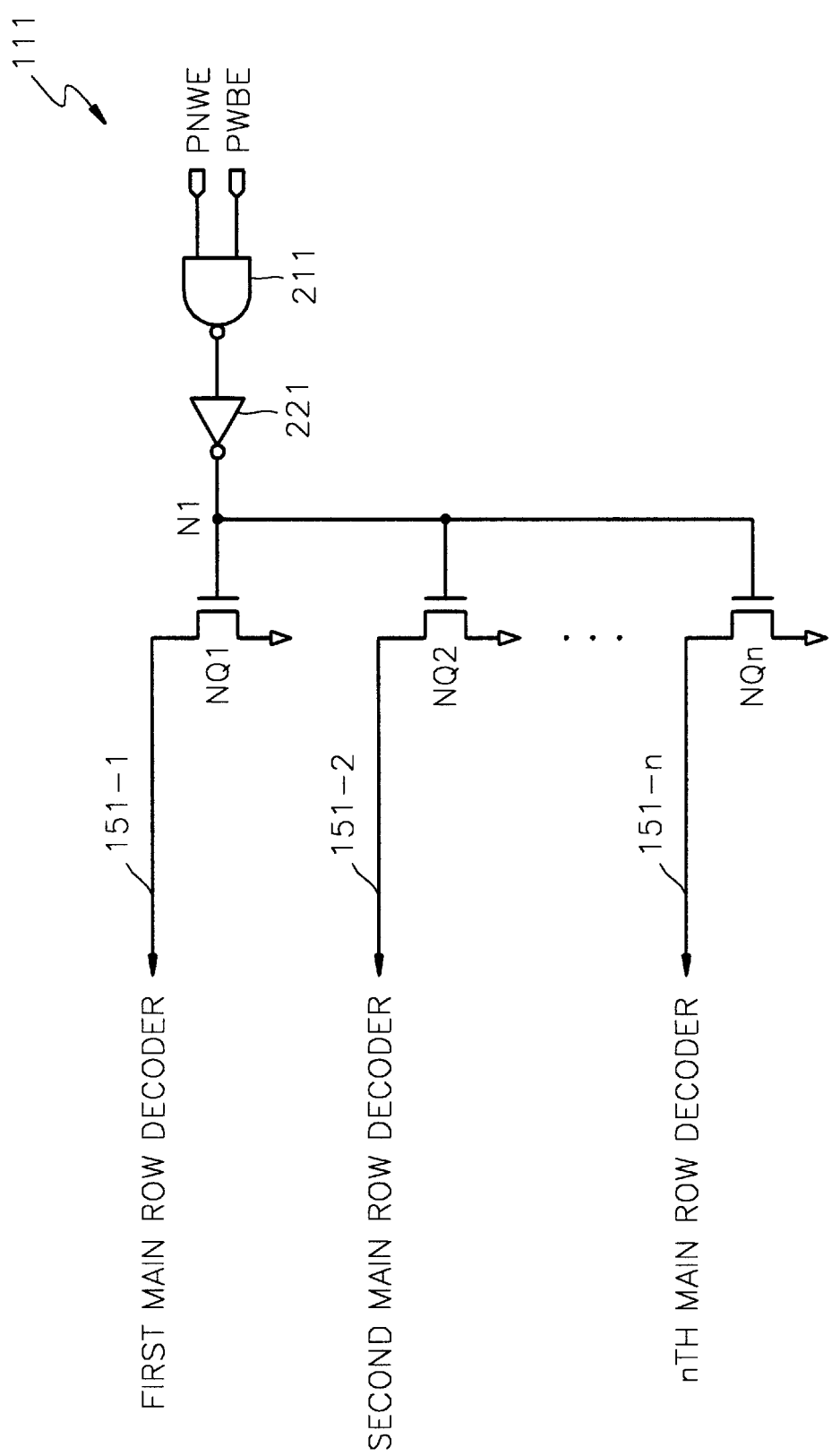
FIG. 2 is a circuit diagram of the burn-in controller shown in FIG. 1.

FIG. 2 is a circuit diagram of an exemplary embodiment of the burn controller 111. Referring to FIG. 2, the burn-in controller 111 includes a NAND gate 211, an inverter 221, and NMOS transistors NQ1 through NQn. The NAND gate 211 receives and performs a NAND operation on the master clock signal PNWE and the wafer burn-in enable signal PWBE. More specifically, the NAND gate 211 outputs logic low when the master clock signal PNWE and the wafer burn-in enable signal PWBE are logic high and outputs logic high when either the master clock signal PNWE or the wafer burn-in enable signal PWBE is logic low.

The inverter 221 inverts the output of the NAND gate 211.

The drains of the NMOS transistors NQ1 through NQn connect to first through nth main row decoders (RD1 through RDn of FIG. 3) through metal lines 151-1 through 151-n. The sources of the NMOS transistors NQ1 through NQn are grounded. The first through nth main row decoders (RD1 through RDn of FIG. 3) are described with reference to FIG. 3. The gates of the NMOS transistors NQ1 through NQn connect to a node N1 at the output terminal of the inverter 221. Therefore, the NMOS transistors NQ1 through NQn turn on and supply ground voltage Vss to the main row decoders when the master clock signal PNWE and the wafer burn-in enable signal PWBE are logic high. When either the master clock signal PNWE or the wafer burn-in enable signal PWBE is logic low, the NMOS transistors NQ1 through NQn are off. Therefore, the burn-in controller 111 does not affect the main row decoders (RD1 through RDn) when either the master clock signal PNWE or the wafer burn-in enable signal PWBE is logic low.

The number of NMOS transistors NQ 1 through NQn depends on the characteristics of the semiconductor memory device 101. The burn-in controller 111 is further subject to wide variations. For example, each of the NMOS transistors NQ1 through NQn can be replaced by other switching means such as a transmission gate or a PMOS transistor. Also, a variety of different logic circuits can replace the NAND gate 211 and the inverter 221. The implementation of such logic typically depends on the switches or transistors NQ1 to NQn used.

The row decoding block 121 connects to the burn-in controller 111 through metal lines 151-1 to 151-n. As shown in FIG. 1, the row decoding block 121 receives a plurality of predecoding signals DRAjk from the predecoder 161, a precharging signal PDPXP, and the master clock signals PNWE. The row decoding block generates a plurality of wordline enable signals NWEi. When the semiconductor memory device 101 receives a row address RADDR for a memory access, the predecoder 161 predecodes the row address and generates the plurality of predecoding signals DRAjk according to the row address RADDR. The number of predecoding signals DRAjk depends on the size of the row address. When the number of row address bits is large, the number of the predecoding signals DRAjk is large.

Figure 3:
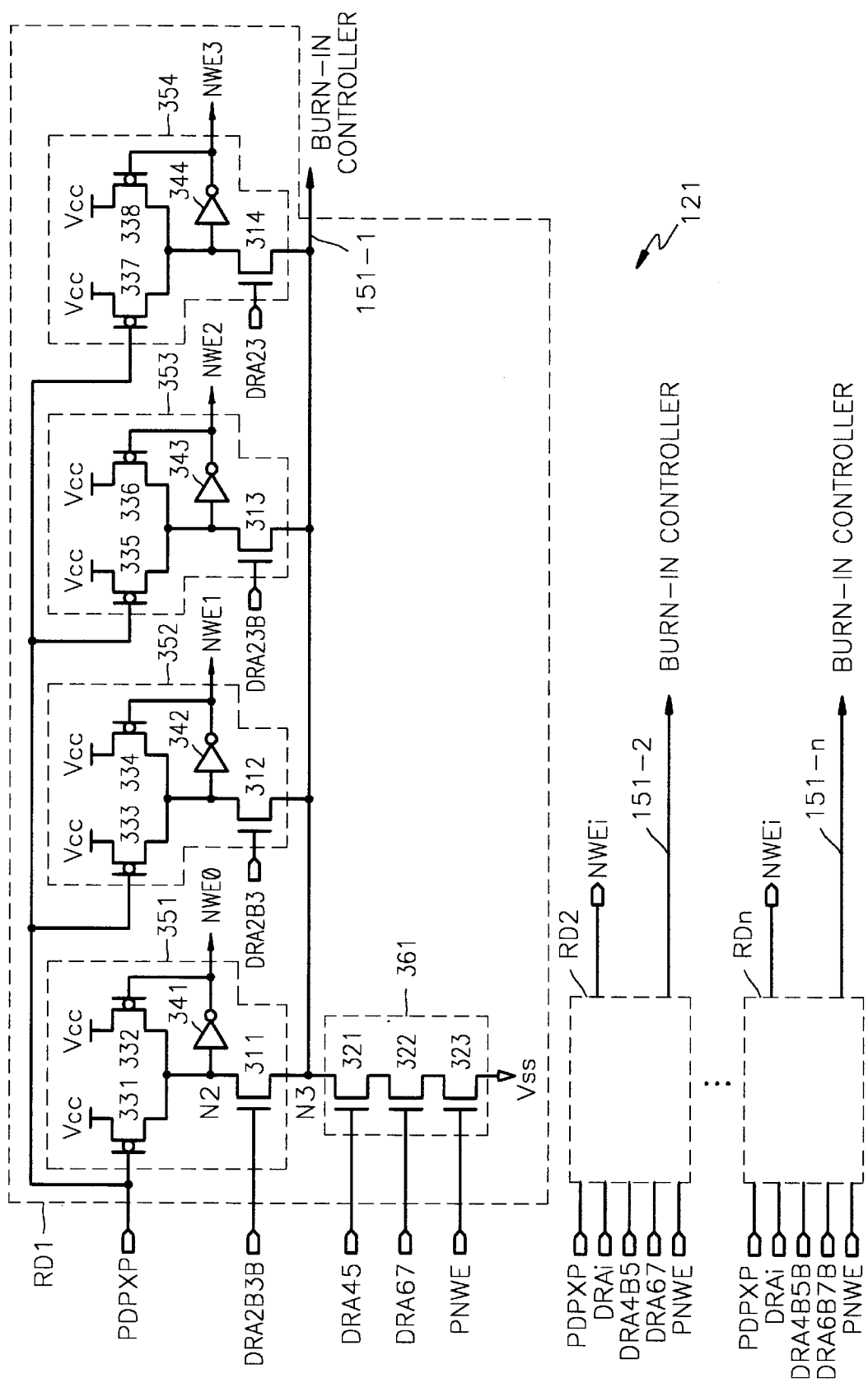
FIG. 3 is a circuit diagram of the row decoding block shown in FIG. 1.

FIG. 3 is a partial circuit diagram of an embodiment of the row decoding block 121. In FIG. 3, the row decoding block 121 includes the first through nth main row decoders RD1 through RDn. Each of the main row decoders RDI through RDn receives the precharging signal PDPXP, the master clock signal PNWE, and a plurality of predecoding signals. The predecoding signals include lower predecoding signals DRA2B3B, DRA2B3, DRA23B, and DRA23 (referred to collectively as signals DRAi) and upper predecoding signals (e.g., signals DRA45 and DRA67 for the main row decoder RD1). Each of the main row decoders receives a unique combination of the upper predecoding signals, and the logic states of the upper predecoding signals select which of main row decoders RD1 through RDn is activated during a normal memory access. The lower predecoding signals DRAi select which of the four wordlines associated with the main row decoder are enabled. Each main decoder generates a plurality of wordline enable signals NWE0 through NWE3 respectively for the four wordlines associated with that main row decoder.

The structures and operations of the first through nth main row decoders RD1 through RDN are substantially the same. Accordingly, only the structure and operation of the first main row decoder RD1 is described here. The first main row decoder RD1 includes a main row decoding unit 361 and wordline enable signal generators 351 through 354. The main row decoding unit 361 includes series-connected NMOS transistors 321 through 323. The upper predecoding signals DRA45 and DRA67 gate NMOS transistors 321 and 322. The master clock signal PNWE gates the NMOS transistor 323. When the master clock signal PNWE is asserted to logic high, the main decoding unit 361 is activated if the predecoding signals DRA45 and DRA67 are in the logic high state. When signals DRA45, DRA67, and PNWE are all asserted, the NMOS transistors 321 through 323 are on and lower the voltage level of a node N3 to a ground voltage Vss. The main row decoding unit 361 thus decodes the upper predecoding signals DRA45 and DRA67 and outputs the ground voltage Vss when the upper predecoding signals DRA45 and DRA67 designate a wordline associated with the main decoder RD1.

The wordline enable signal generators 351 through 354 receive the precharging signal PDPXP and the lower predecoding signals DRA2B3B, DRA2B3, DRA23B, and DRA23 and generate wordline enable signals NWE0, NWE1, NWE2, and NWE3. The first through fourth wordline enable signal generators 351 through 354 include PMOS transistors 331 through 338, NMOS transistors 311 through 314, and inverters 341 through 344.

The structures and operations of the first through fourth wordline enable signal generators 351 through 354 are the same, and only the first wordline enable signal generator 351 is described. The first wordline enable signal generator 351 includes the PMOS transistors 331 and 332, the inverter 341, and the NMOS transistor 311. The precharging signal PDPXP gates the PMOS transistor 331. In particular, the PMOS transistor 331 turns on when the precharging signal PDPXP is asserted to logic low and thereby precharges a node N2 to a supply voltage Vcc. When the node N2 is at the supply voltage Vcc, inverter 341 negates the wordline enable signal NWE0 to logic low. The PMOS transistor 332 and the inverter 341 have a latch function. When PMOS transistor 331 precharges the node N2 to the supply voltage Vcc, the inverter 341 inverts the voltage of the node N2 and turns on the PMOS transistor 332 to keep the node N2 at the supply voltage Vcc. Accordingly, the wordline enable signal NWEO is negated to logic low when the first wordline enable signal generator is in the precharged state. The wordline enable signals NWE1 through NWE3 are similarly negated in the precharged state.

The lower predecoding signal DRA2B3B gates the NMOS transistor 311. The lower predecoding signal DRA2B3B when at a logic high level turns on the NMOS transistor 311, which then connects the node N3 to node N2. With transistor 311 on and the node N3 at the ground voltage Vss, the voltage level of the node N2 drops to the ground voltage Vss if the current through the transistor 311 is initially greater than the current through the transistor 332. In response, inverter 341 asserts the wordline enable signal NWE0 to logic high. (The second through fourth wordline enable signal generators 352 through 354 similarly assert the respective enable signals NWE1 to NWE3 in response to respective lower predecoding signals DRA2B3, DRA23B, and DRA23.)

If the wordline enable signal generator 351 did not include the PMOS transistor 332, the voltage on the node N2 would float during the time between negating the precharging signal PDPXP and asserting the predecoding signal DRA2B3B. While the node N2 floated, the wordline enable signal NWE0 would not be defined, and the semiconductor memory device 101 may mis-operate. To prevent the mis-operation of the semiconductor memory device 101, the PMOS transistor 332 keeps the voltage level of the node N2 at the supply voltage Vcc (i.e., the precharged state) until the predecoding signal DRA2B3B is asserted.

The burn-in controller 111 connects to the node N3. When the output voltage level of the burn-in controller 111 is the ground voltage Vss, the voltage level of the node N3 is the ground voltage Vss regardless of the upper predecoding signals DRA45 and DRA67. Accordingly, the burn-in controller simultaneously activates all of the main decoders RD1 to RDn, and when the lower predecoding signal DRA2B3B becomes logic high, the wordline enable signal NWE0 is enabled from each main decoder RD1 to RDn. Further, the predecoder 161 can simultaneously assert all of lower predecoding signals DRAi for the burn-in test. With all lower predcoding signals DRAi asserted during burn-in, supply current in the main decoder RD1 flows through the PMOS transistors 332, 334, 336, and 338, the NMOS transistors 311, 312, 313, and 314, and NQ1 of FIG. 2. The NMOS transistors NQ1 can be sized and connected to carry a current sufficient to simultaneously enable multiple wordlines during a wafer burn-in. In contrast, the NMOS transistors 321 through 323 can be small and sufficient for enabling only a single wordline during a normal memory access. The number of the series-connected NMOS transistors that the upper predecoding signals gate for memory accesses (e.g., transistors 321 and 322) depends on the number of row address bits. Making all of these series-connected transistors and related connections sufficiently large to simultaneously enable multiple wordlines would require a large integrated circuit area and may be difficult to accommodate within the pitch of the memory array.

In the exemplary embodiment illustrated in FIG. 3, each main row decoder includes four wordline enable signal generators. Alternatively, the number of wordline enable signal generators can depend on the characteristics of the semiconductor memory device 101. For example, each main row decoder could include eight wordline enable signal generators.

The burn-in controller 111 connects to the node N3 in FIG. 3. Alternatively, the burn-in controller 111 can connect to the nodes N2 in the wordline enable signal generators 351 through 354. In this alternative embodiment, the NMOS transistors 311 through 314 are effectively included in the main row decoding unit 361, and the predecoding signals DRAi, DRA45, and DRA67 and the master clock signal PNWE control the main row decoding unit 361.

The burn-in controller 111 can additionally connect to a row decoding block for redundant wordlines in the same manner described above for the wordlines in the memory cell array. Accordingly, the burn-in controller can cause the generation of wordline enable signals for the redundant wordlines simultaneously with enabling the wordlines.

The wordline driving block 131 controls a plurality of wordlines WL0 through WLn in response to the wordline enable signals NWEi. When the wordline enable signal generators assert the wordline enable signals NWEi, wordline driving block 131 activates the plurality of wordlines WL0 through WLn by driving the appropriate voltage for a memory access.

According to the present invention, the driving ability of the wordline enable signal generators is improved by addition of the burn-in controller 111. Therefore, although the NMOS transistors included in the main row decoders for decoding the predecoding signals are small, the row decoding block can sufficiently activate the wordlines WL0 through WLn during the wafer burn-in of the semiconductor memory device 101.

The drawings and specification disclose exemplary embodiments of the invention, and although specific terms are employed, those terms are used in a generic and descriptive sense and not for purposes of limitation. Various changes in form and details of the described embodiments may be made without departing from the spirit and scope of the invention as defined by the appended claims.

What is claimed is:

1. A semiconductor memory device comprising:
   a wordline driving block for driving wordlines;
   a burn-in controller that responds to a wafer burn-in enable signal by setting the semiconductor memory device in a wafer burn-in mode; and
   a row decoding block connected to the burn-in controller and the wordline driving block, wherein the row decoding block asserts a plurality of wordline enable signals for controlling the wordline driving block in response to the burn-in controller when the semiconductor memory device is in the wafer burn-in mode, wherein:
   the burn-in controller receives a master clock signal for controlling the decoding operation of the row decoding block; and
   when the semiconductor memory device is in the wafer burn-in mode, the master clock signal and the wafer burn-in enable signal are enabled, and the row decoding block receives the output of the burn-in controller and asserts the wordline enable signals to activate the plurality of wordlines.

2. A semiconductor memory device comprising:
   a wordline driving block for driving wordlines;
   a burn-in controller that responds to a wafer burn-in enable signal by setting the semiconductor memory device in a wafer burn-in mode; and
   a row decoding block connected to the burn-in controller and the wordline driving block, wherein the row decoding block generates a plurality of wordline enable signals for controlling the wordline driving block in response to the burn-in controller when the semiconductor memory device is in the wafer burn-in mode, wherein the row decoding block comprises a plurality of main row decoders, and each of the main row decoders comprises:
   a main row decoding unit connected to the burn-in controller for receiving a master clock signal and a plurality of predecoding signals and decoding the plurality of predecoding signals when the master clock signal is enabled; and
   a wordline enable signal generator connected to the main row decoding unit and the wordline driving block, for receiving a precharging signal, generating one among the plurality of wordline enable signals, deactivating the wordline enable signal when the precharging signal is enabled, and activating the wordline enable signal in response to the output of the burn-in controller in the wafer burn-in mode.

3. The semiconductor memory device of claim 2, wherein the burn-in controller outputs ground voltage in the wafer burn-in mode.

4. A semiconductor memory device including a wordline driving block for driving a plurality of wordlines and a predecoder for predecoding a row address received from the outside and generating a plurality of predecoding signals, comprising:
   a burn-in controller for receiving a wafer burn-in enable signal for setting a wafer burn-in mode of the semiconductor memory device; and
   a row decoding block connected to the burn-in controller and the wordline driving block for generating a plurality of wordline enable signals for controlling the wordline driving block, wherein the row decoding block comprises a plurality of main row decoders, and each of the main row decoders comprises:

a main row decoding unit connected to the burn-in controller for receiving upper predecoding signals among the plurality of predecoding signals and decoding the upper predecoding signals; and at least four wordline enable signal generators connected to the main row decoding unit and the wordline driving block, for receiving a precharging signal and lower predecoding signals among the plurality of predecoding signals, generating some of the plurality of wordline enable signals, deactivating the wordline enable signals when the precharging signal is enabled, and controlling some of the wordline enable signals in response to the lower predecoding signals and output from the burn-in controller in the wafer burn-in mode.

5. The semiconductor memory device of claim 4, wherein the lower predecoding signals and the wafer burn-in enable signal are enabled and the at least four wordline enable signal generators are activated, thus enabling the wordline enable signals, in the wafer burn-in mode.

6. The semiconductor memory device of claim 4, wherein the burn-in controller further receives a master clock signal for controlling the decoding operation of the row decoding block.

7. The semiconductor memory device of claim 6, wherein when the semiconductor memory device is in the wafer burn-in mode, the master clock signal and the wafer burn-in enable signal are enabled, and the at least four wordline enable signal generators receive the output of the burn-in controller and enable the wordline enable signals, thus activating the plurality of wordlines.

8. The semiconductor memory device of claim 4, wherein the burn-in controller outputs ground voltage in the wafer burn-in mode.

9. The semiconductor memory device of claim 4, wherein the precharging signal is enabled when the semiconductor memory device is set to be in a stand-by state.

10. The semiconductor memory device of claim 4, wherein the burn-in controller controls enabling redundant wordlines in the wafer burn-in mode.

11. A semiconductor memory device comprising:

a plurality of row decoders, wherein each row decoder is associated with a plurality of wordlines, and each of the row decoders comprises:

a main decoding unit that activates the row decoder when an external address identifies one of the wordlines associated with the row decoder; and a plurality of wordline enable signal generators, each wordline enable signal generator generating a wordline enable signal for a corresponding one of the wordlines when the row decoder is activated; and a burn-in controller coupled to the plurality of row decoders, wherein the burn-in controller bypasses the main decoding units and activates the row decoders when the semiconductor memory device is in a wafer burn-in mode.

12. The device of claim 11, wherein:

in each row decoder, the main decoding unit comprises a set of series-connected transistors coupled between a first node and a first voltage, wherein the main decoding unit activates the row decoder when the series-connected transistors conduct and pull the first node to the first voltage; and the burn-in controller is coupled to the first nodes in the row decoders.

13. The device of claim 12, wherein the burn-in controller includes a plurality of transistors each connected between a corresponding one of the first nodes and the first voltage, and the transistors in the burn-in controller are larger than the series connected transistors in the main decoding units.

14. The device of claim 12, wherein:

each of the wordline enable signal generators includes a device coupled between a second voltage and the first node of the row decoder containing the wordline enable signal generator;

each of the transistors from the sets of series-connected transistors is sized to pull the associated first node to the first voltage when one of the devices in the associated wordline enable signal generators conducts current pulling that first node toward the second voltage; and each of the transistors in the burn-in controller is sized to pull the associated first node to the first voltage when multiple devices in the wordline enable signal generators conduct current pulling that first node toward the second voltage.

15. The device of claim 11, further comprising a predecoder that generates upper predecoding signals and lower predecoding signals from the external address, wherein each main decoding unit activates its row decoder in response to the upper predecoding signals, and the wordline enable signal generators assert wordline enable signals in response to the lower predecoding signals.

\* \* \* \* \*